(12) United States Patent
Mori (10) Patent No.: US 8,273,646 B2
(45) Date of Patent: Sep. 25, 2012

(54) NON-VOLATILE MEMORY DEVICE

(75) Inventor: Toru Mori, Miyagi (JP)

(73) Assignee: Lapis Semiconductor Co., Ltd., Yokohama (JP)

( * ) Notice: Subject to any disclaimer, the term of this patent is extended or adjusted under 35 U.S.C. 154(b) by 29 days.

(21) Appl. No.: 13/064,204

(22) Filed: Mar. 10, 2011

(65) Prior Publication Data

US 2011/0165770 A1    Jul. 7, 2011

Related U.S. Application Data

(63) Continuation of application No. 12/314,956, filed on Dec. 19, 2008, now Pat. No. 7,923,765.

(30) Foreign Application Priority Data

Dec. 24, 2007 (JP) .................. 2007-331239

(51) Int. Cl.
*H01L 21/28* (2006.01)
*H01L 29/788* (2006.01)
*H01L 29/423* (2006.01)

(52) U.S. Cl. ........ 438/591; 257/315; 257/316; 257/324; 257/E29.3; 257/E29.129; 257/E21.21

(58) Field of Classification Search .................. 257/314, 257/315, 316, 324, E29.3, E29.129, E21.21; 438/591
See application file for complete search history.

(56) References Cited

U.S. PATENT DOCUMENTS

| | | | |
|---|---|---|---|
| 6,927,446 B2* | 8/2005 | Yoshino | 257/314 |
| 7,211,866 B2* | 5/2007 | Yuan et al | 257/350 |
| 2003/0178671 A1* | 9/2003 | Takahashi | 257/315 |
| 2007/0052000 A1* | 3/2007 | Lee | 257/314 |
| 2007/0221978 A1* | 9/2007 | Tsuji | 257/306 |

FOREIGN PATENT DOCUMENTS

JP  2004-343014 A  12/2004
JP  2007-157874 A  6/2007

* cited by examiner

*Primary Examiner* — Victor A Mandala
(74) *Attorney, Agent, or Firm* — Rabin & Berdo, P.C.

(57) ABSTRACT

A non-volatile memory device includes a memory cell region which is formed on a semiconductor substrate to store predetermined information, and a peripheral circuit region which is formed on the semiconductor substrate. The memory cell region includes a gate electrode; and a charge storage layer, the charge storage layer being formed to be a notch or wedge shape having an edge extending into both sides of a bottom end of the gate electrode. The peripheral circuit region includes no charge storage layer therein.

7 Claims, 14 Drawing Sheets

MEMORY CELL REGION

PERIPHERAL CIRCUIT REGION
(OUT OF MEMORY CELL)

NON-VOLATILE MEMORY DEVICE

CROSS REFERENCE TO RELATED APPLICATION

This is a Continuation of U.S. Application Ser. No. 12/314,956, filed Dec. 19, 2008, now U.S. Pat. No. 7,923,765 and allowed on Dec. 13, 2010, the subject matter of which is incorporated herein by reference.

This application claims the priority of Application No. 2007-331239, filed Dec. 24, 2007 in Japan, the subject matter of which is incorporated herein by reference.

TECHNICAL FIELD OF THE INVENTION

The present invention relates to a non-volatile memory device and a method for fabricating the same. In particular, the present invention relates to a non-volatile memory device having a three-layered region, including two oxide layers and an insulating layer formed between them.

BACKGROUND OF THE INVENTION

A "MONOS" (Metal Oxide Nitride Oxide Semiconductor) structure is used for a non-volatile memory device. According to a MONOS structure, for example, an ONO (nitride layer is formed between two of oxide layers) layer is formed between a substrate and a gate electrode. The nitride layer in the ONO layer traps (stores) a large amount of charge. Trapping and releasing of charges allows the non-volatile memory to function as a memory device properly.

In order to perform writing/reading operation, electrons are stored and removing on a bottom entire surface of a gate electrode using tunneling current. Another way to perform writing/reading operation, hot carrier is used. According to the way of using tunneling current, a large number of writing operation can be carried out and a higher reliability can be obtained. On the other hand, according to the way of using hot carrier, operation voltage for writing and deleting is low and operation speed is high.

Figure 1:
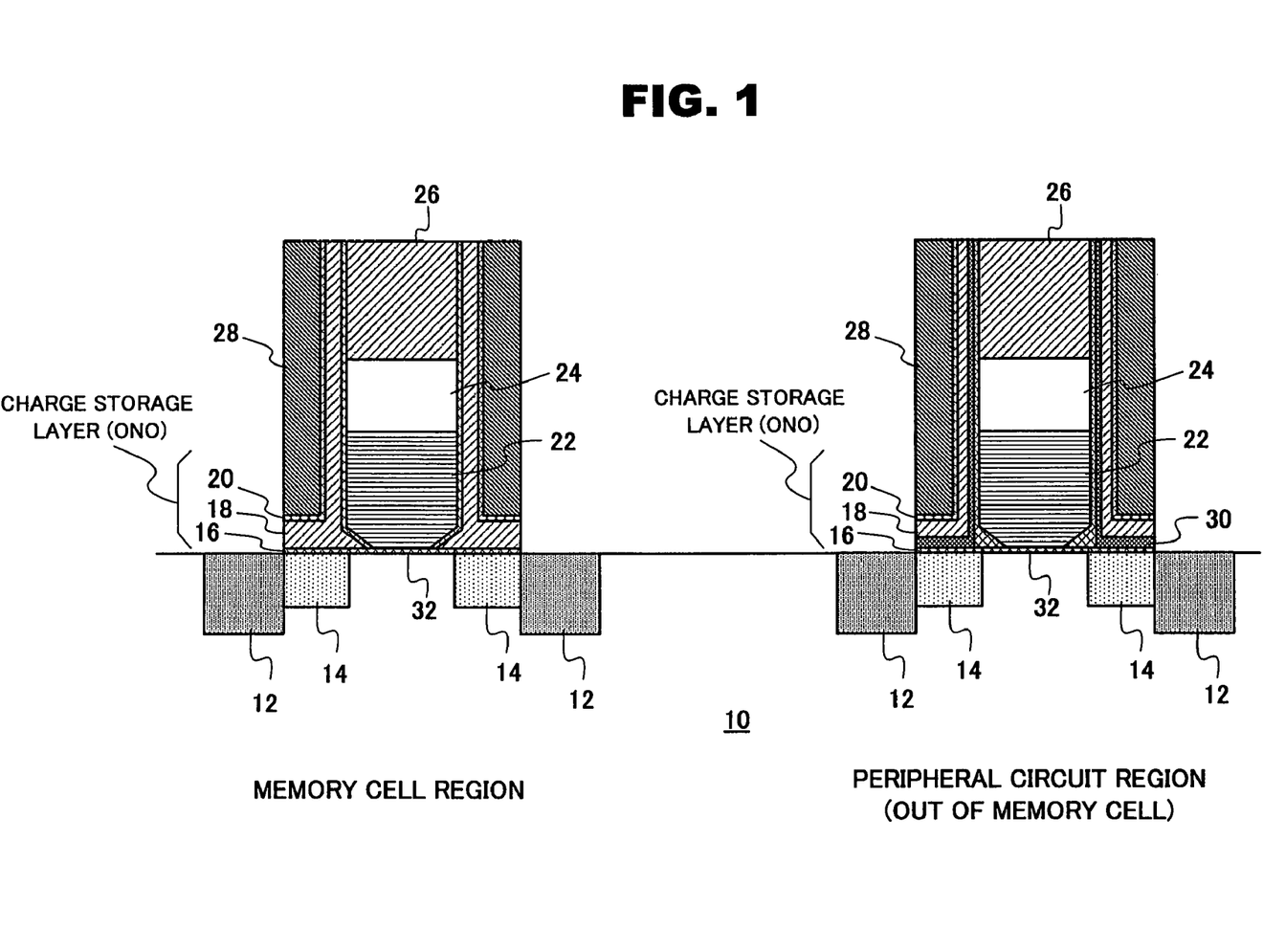
FIG. 1 is a cross-sectional view illustrating a conventional semiconductor device.

FIG. 1 shows a structure of a conventional semiconductor memory device. In FIG. 1, a memory cell region is shown at the left side while a peripheral circuit region (transistor which does not form a memory cell) is shown at the right side. According to the conventional memory device, shown in FIG. 1, two-bit data can be stored in a single cell. Electrons are stored or trapped at the right and left sides of an ONO (Oxide-Nitride-Oxide) layer 16, 18, 20, which is formed on the right and left sides of a gate electrode.

When storing electrons in a charge storage layer 18, a source and a substrate are grounded, while a gate and a drain are applied with a high voltage. In this stage, since a strong electric field in a transverse direction is generated around the drain, and electrons passed through a channel get in a high-energy condition (hot electrons), those hot electrons get close to (pulled toward) an electric field in a vertical direction generated around the gate electrode. When reading data, electrons are stored in a nitride layer 18 of the ONO layer, formed at a lower portion of a side wall, so that a resistance value of an n– layer, formed at a lower portion of the ONO layer, is changed. As a result, the read data can be distinguished between "1" and "0".

In structure, as shown in FIG. 1, an N+ region 12 and an N– region 14 are formed in a surface area of a silicon substrate 10. A silicon oxide layer 16, a poly-silicon layer 22, WSi layer 24 and a SiN layer 26 are formed on the silicon substrate 10. A nitride layer 18, a silicon oxide layer 20 and an insulating layer 28 are formed (layered) on a sidewall of the gate electrode. Those layers 18, 20 and 28 are used for storing electric charge.

Next, the structure of a peripheral circuit region (not a memory cell region) is described. An N+ region 12 and an N– region 14 are formed in a surface area of a silicon substrate 10, in the same manner as the memory cell region. A silicon oxide layer 16, a poly-silicon layer 22, WSi layer 24 and a SiN layer 26 are formed on the silicon substrate 10. A silicon oxide layer, a NSG layer 30, a nitride layer 18 for storing electric charge, a silicon oxide layer 20 and an insulating layer 28 are formed (layered) on a sidewall of the gate electrode.

FIGS. 2 to 6 show fabrication steps of a conventional non-volatile memory device, shown in FIG. 1.

Figure 2:
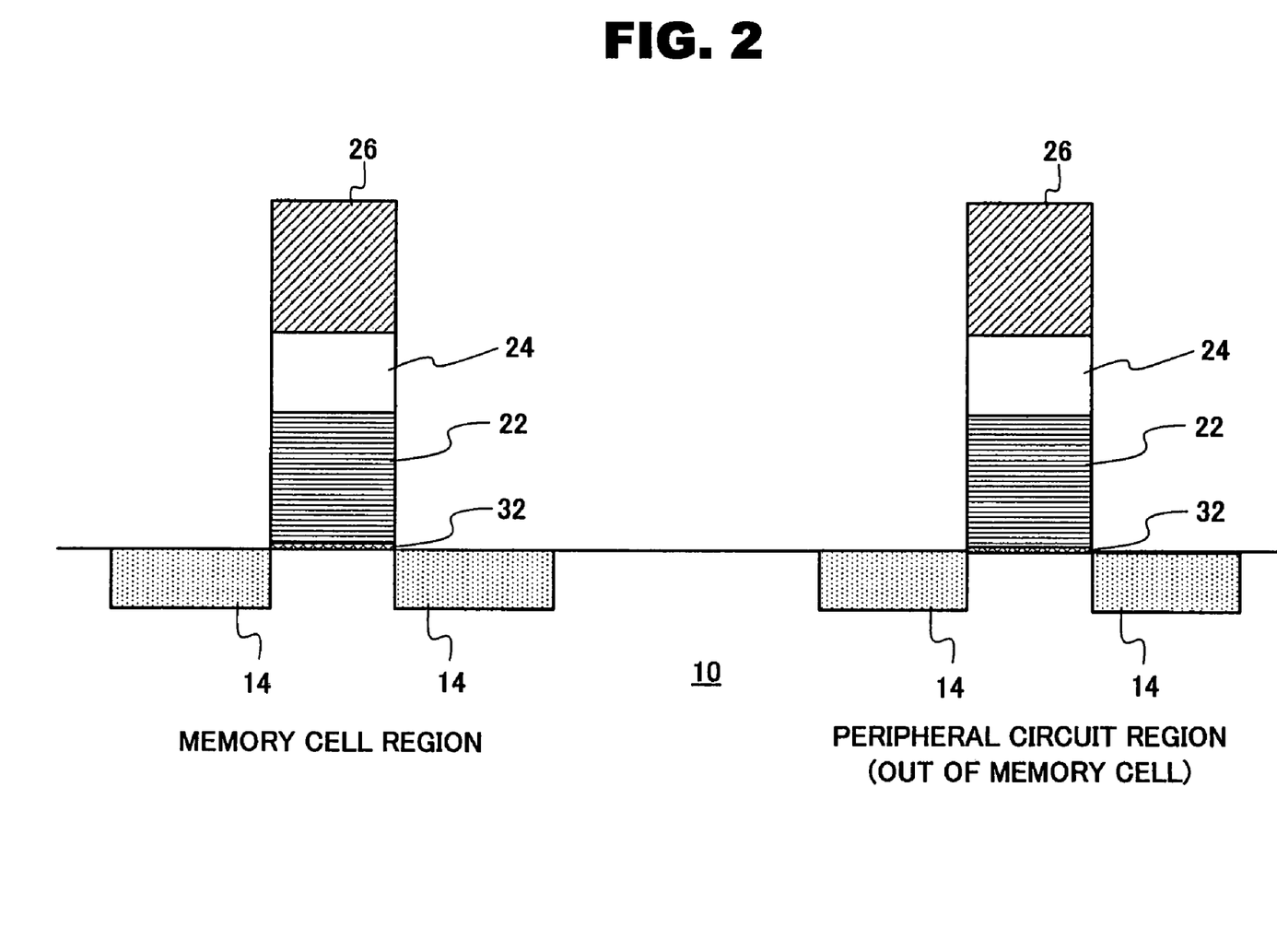
FIG. 2 is a cross-sectional view showing a fabrication step of the conventional semiconductor device, shown in FIG. 1.

Firstly, a silicon oxide layer 32, a poly-silicon layer 22, a WSi layer 24 and a silicon nitride layer 26 are formed on a silicon substrate 10.

Next, a gate electrode is shaped by a lithographic process. Subsequently, the silicon nitride layer 26 is etched by a dry-etching process. After that, the WSi layer 24 and the poly-silicon layer 22 are dry-etched.

Next, a resist layer is removed by an ashing process and wet-washing process to form a gate electrode, as shown in FIG. 2. After that, ions are implanted into the silicon substrate 10 to form an N– region 14.

Figure 3:
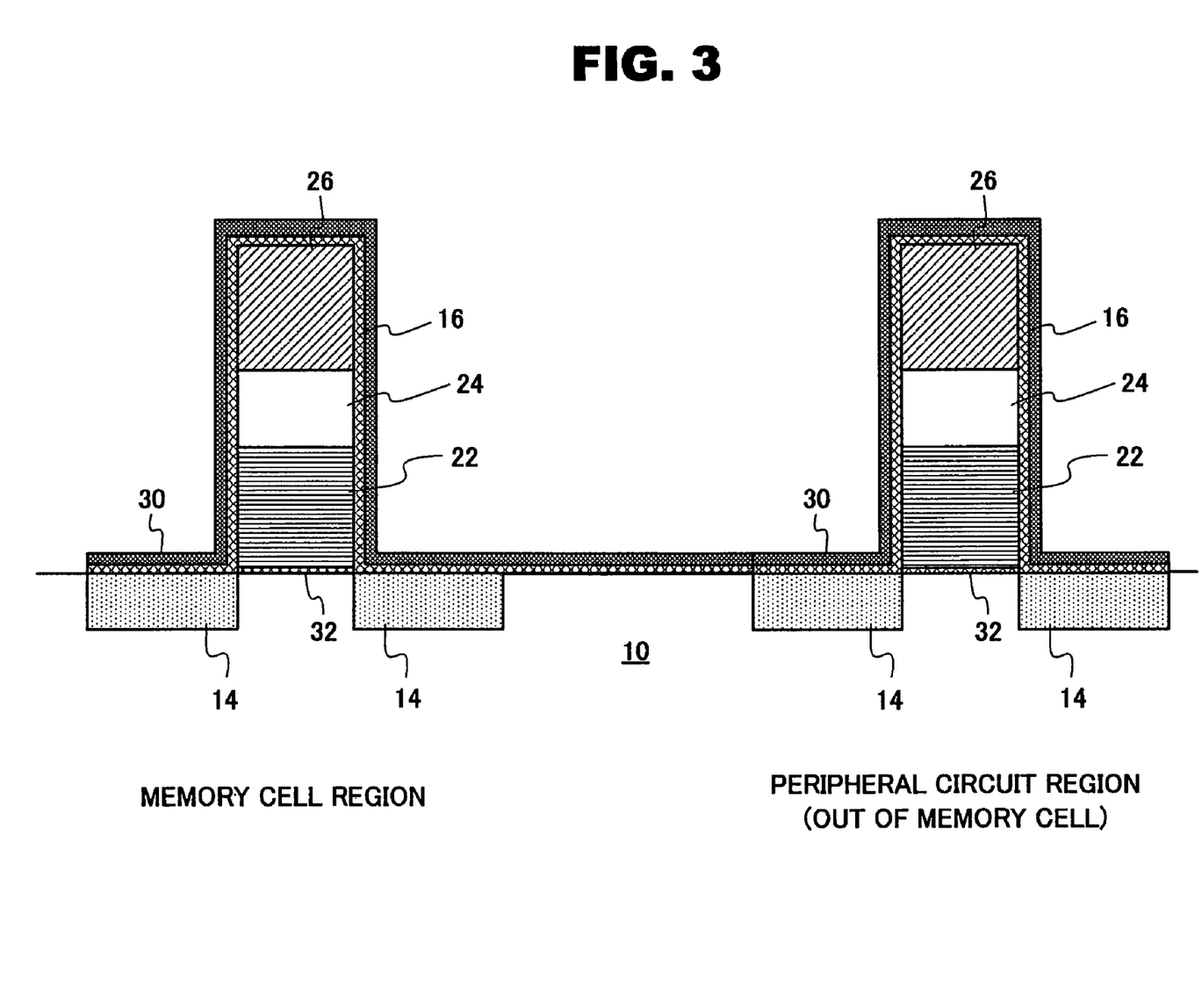
FIG. 3 is a cross-sectional view showing a fabrication step of the conventional semiconductor device, shown in FIG. 1.

Next, a silicon oxide layer 16 is formed by a thermal oxidation process, as shown in FIG. 3. After that, an NSG layer 30 is formed at a surface area of the silicon oxide layer 16.

Figure 4:
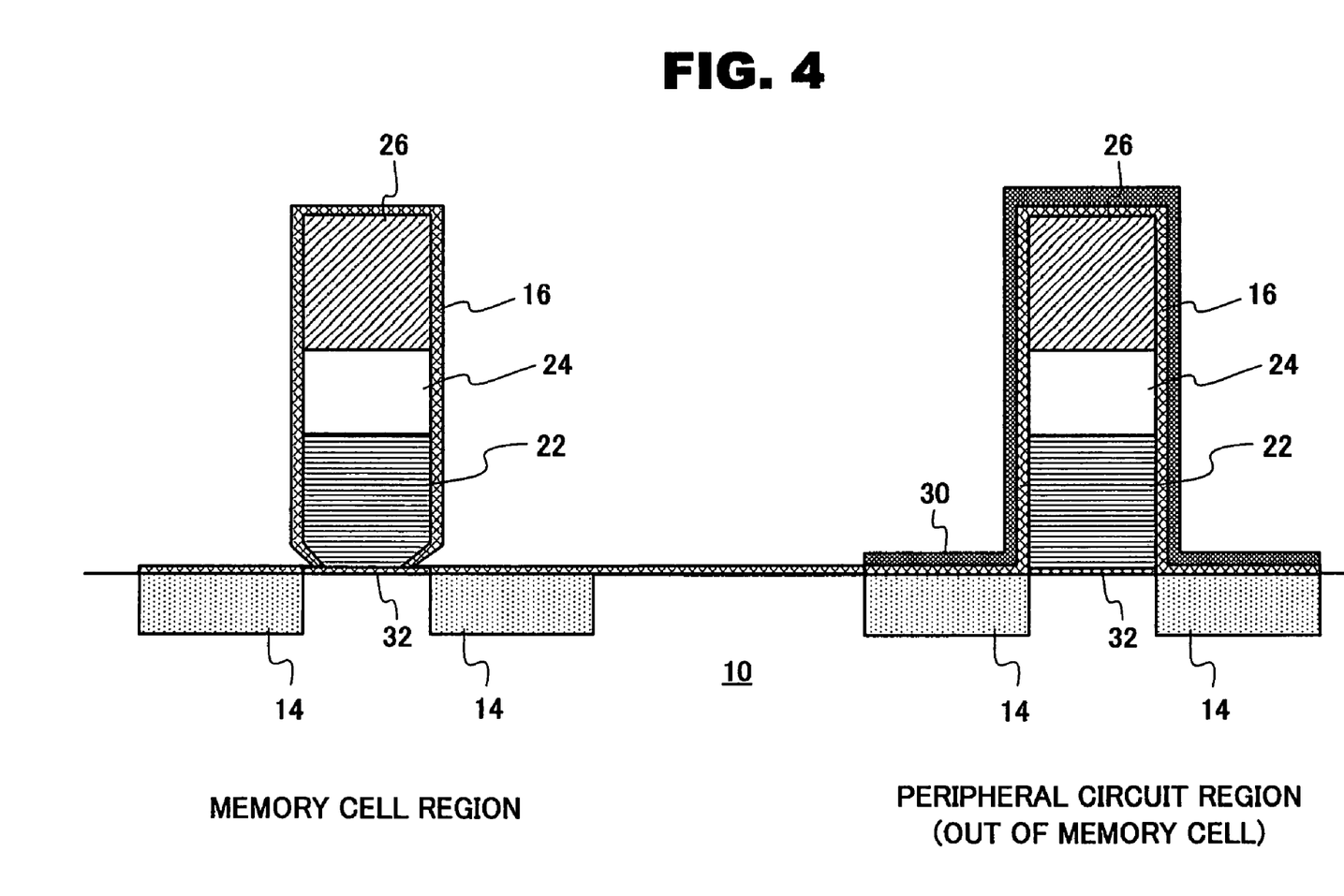
FIG. 4 is a cross-sectional view showing a fabrication step of the conventional semiconductor device, shown in FIG. 1.

Next, as shown in FIG. 4, a part of the NSG layer 30 located in a memory cell region is removed by a photo-lithography process and an etching process. At this time, a part of the NSG layer 30 located in a peripheral circuit region is not removed but remained.

Figure 5:
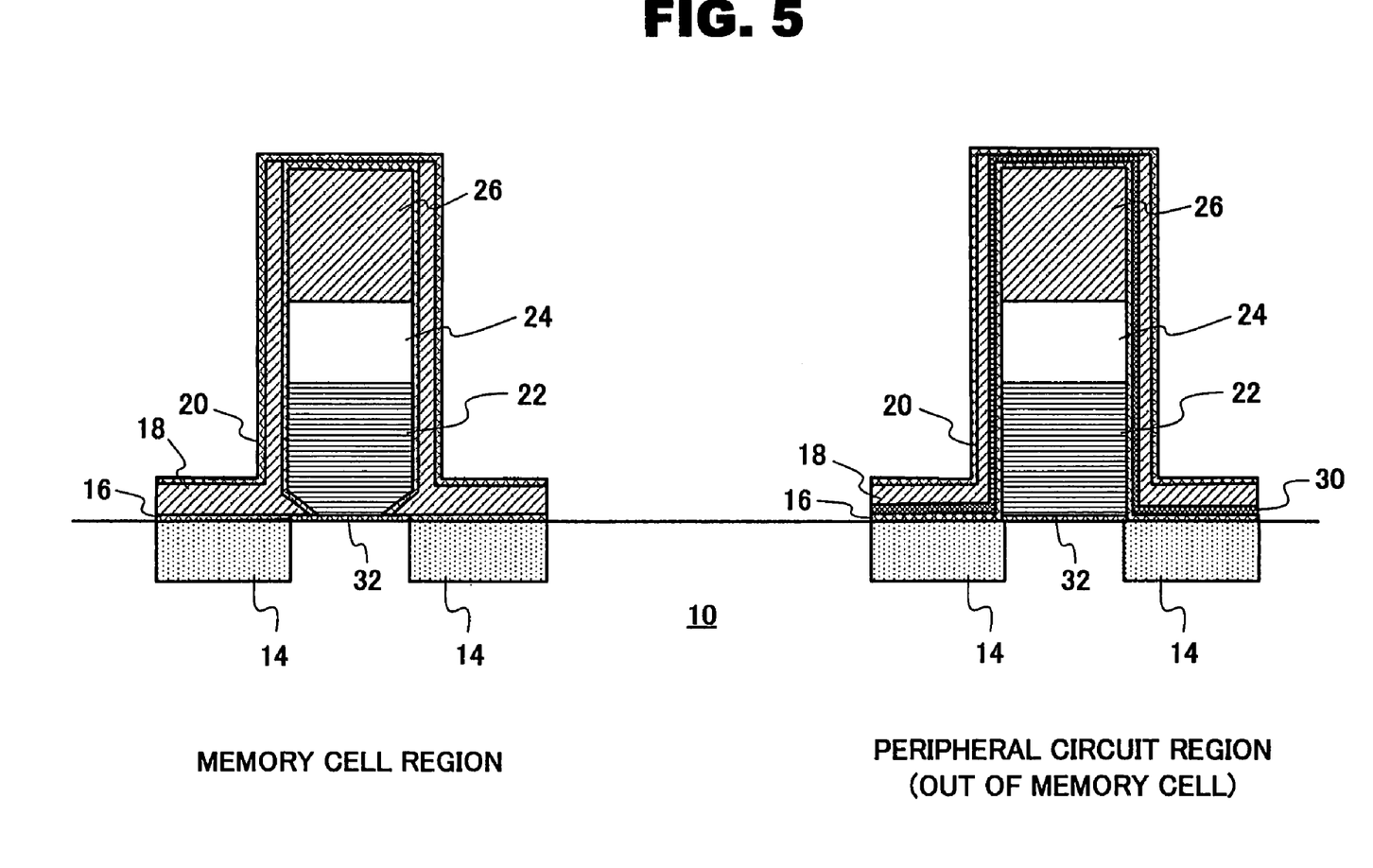
FIG. 5 is a cross-sectional view showing a fabrication step of the conventional semiconductor device, shown in FIG. 1.

Next, as shown in FIG. 5, a SiN layer 18 is formed on an oxide layer 16 in the memory cell region by a CVD process, while a SiN layer 18 is formed on an NSG layer 30 in the peripheral circuit region by a CVD process. After that, an oxide layer 20 is formed on the SiN layer 18.

Figure 6:
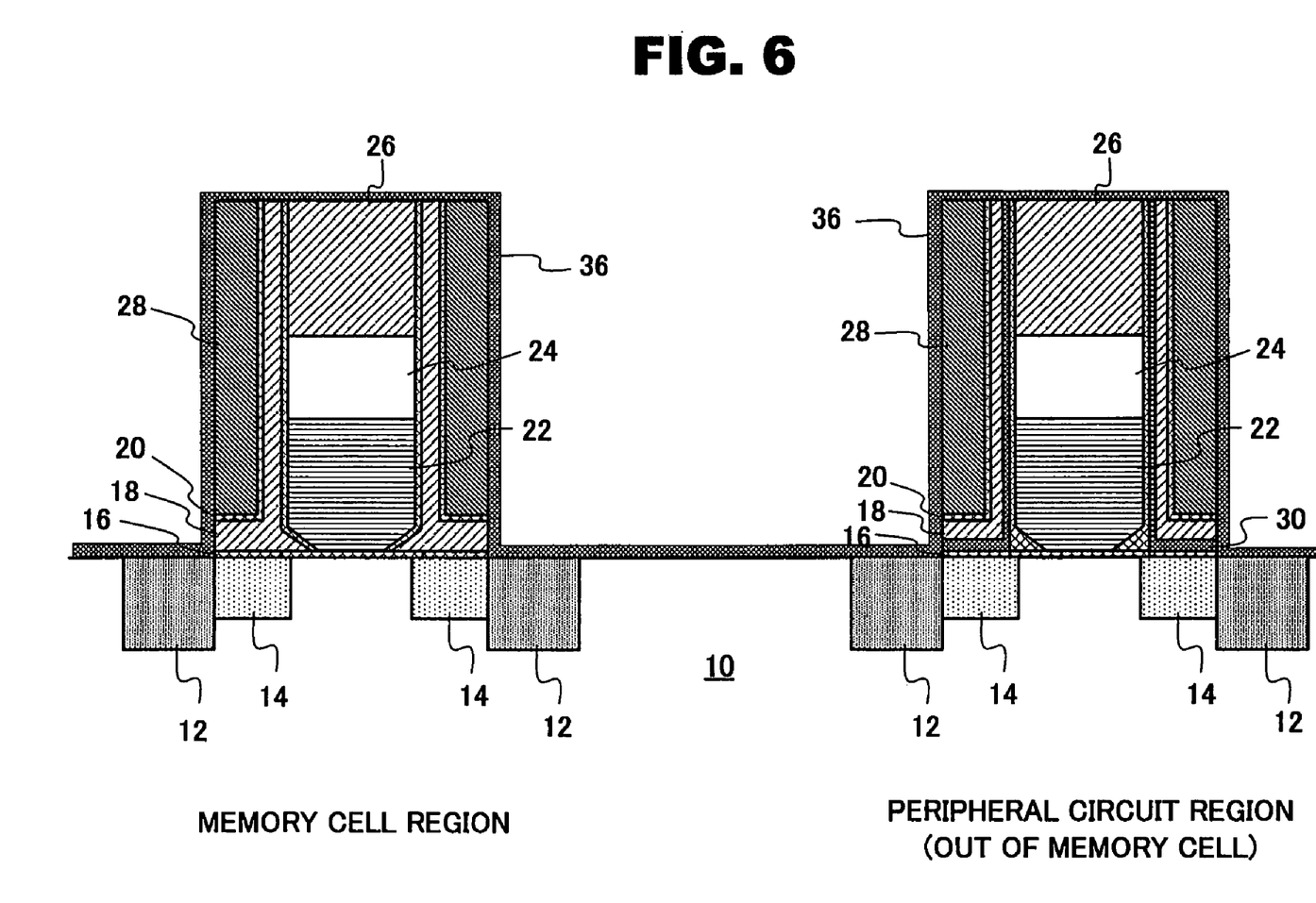
FIG. 6 is a cross-sectional view showing a fabrication step of the conventional semiconductor device, shown in FIG. 1.

Next, as shown in FIG. 6, both in the memory cell region and peripheral circuit region, a SW insulating layer 28 is formed on the oxide layer 20 by a CVD and a dry-etching process.

Subsequently, a NSG layer 36, which is to be used as a mask in a high-density implantation process, is formed on the entire surface including a sidewall 28. The NSG layer 36 may be formed to have a thickness of 100 angstroms (Å) by a CVD process. Next, an N+ layer 12 is formed in a source/drain region of the memory cell region by a photolithography-implantation process. Next, an N+ layer 12 is formed in a source/drain region of the peripheral circuit region by a photolithography-implantation process. A type of impurity to be ion-implanted is selected according to the type of transistors (N or P). After that, as shown in FIG. 1, the NSG layer 36 is removed.

According to the above-described conventional semiconductor device, the nitride layer 18 for storing charge is remained in a peripheral circuit region (not a memory cell region), so that electrons are stored not only in a transistor forming the memory cell region but also in a transistor forming the peripheral circuit. As a result, a hot-carrier characteristic of a transistor in the peripheral circuit is deteriorated.

For that reason, an electric-erasing process is carried out to delete electrons from the nitride layer 18 for storing charge. However, electrons are remained in a part of the nitride layer 18 located above a LDD (14) after the electric-erasing process. As a result, a current value after the erasing process becomes lower than that prior to the erasing process.

A patent publication 1 (JP2007-157874A) describes a non-volatile memory device, which is not material to the present invention.

[Patent Publication 1] JP2007-157874A

A patent publication 2 (JP2004-343014A) describes a non-volatile memory device, in which a depressed portion is formed at an end of a lower part of a gate electrode. However, the publication does not describe the relation between a memory cell region and a peripheral circuit region.

[Patent Publication 2] JP2004-343014A

OBJECTS OF THE INVENTION

Accordingly, an object of the present invention is to provide a non-volatile memory device, in which hot-carrier characteristic in a peripheral circuit region, located out of a memory cell region, can be improved.

Another object of the present invention is to provide a method for fabricating a non-volatile memory device, in which hot-carrier characteristic in a peripheral circuit region, located out of a memory cell region, can be improved.

Further object of the present invention is to provide a non-volatile memory device, in which an electric current value (level) is prevented from being lowered after electrons, stored in a charge storage layer of a memory cell region, is erased.

Still further object of the present invention is to provide a method for fabricating a non-volatile memory device, in which an electric current value (level) is prevented from being lowered after electrons, stored in a charge storage layer of a memory cell region, is erased.

Additional objects, advantages and novel features of the present invention will be set forth in part in the description that follows, and in part will become apparent to those skilled in the art upon examination of the following or may be learned by practice of the invention. The objects and advantages of the invention may be realized and attained by means of the instrumentalities and combinations particularly pointed out in the appended claims.

SUMMARY OF THE INVENTION

According to a first aspect of the present invention, a non-volatile memory device includes a memory cell region which is formed on a semiconductor layer to store predetermined information, and a peripheral circuit region which is formed on the semiconductor layer. The memory cell region includes a gate electrode; and a charge storage layer, the charge storage layer being formed to be a notch or wedge shape having an edge extending into both sides of a bottom end of the gate electrode. The peripheral circuit region includes no charge storage layer therein.

According to a second aspect of the present invention, a method for fabricating a non-volatile memory device includes the steps of forming a gate electrode on a semiconductor layer; forming a thermal oxidation layer and a NSG layer on a surface of the gate electrode; removing the NSG layer located only in a memory cell region by a HF treatment to form a notch or wedge shape gap extending into a bottom end of the gate electrode; forming a charge storage layer on a surface of the gate electrode and into the notch or wedge shape gap; and selectively removing the charge storage layer to remain only inside the notch or wedge shape gap of the memory cell region.

According to the present invention, since a charge storage layer is only formed in a memory cell region, hot carrier characteristic of regions off the memory cell region is improved.

In addition, since a charge storage layer is remained only in a notch-shaped or wedge-shaped space, electric charge is stored only a area adjacent the gate electrode. Therefore, it can be prevented that electrons are remained in a nitride layer (charge storage layer) located above a LDD layer. As a result, it can be restrained that current value (level) is decreased after erasing data from the charge storage layer.

DESCRIPTION OF REFERENCE NUMERALS

110: Semiconductor Substrate
116: Silicon Oxide Layer (Gate Insulating Layer)
118: Silicon Nitride Layer (Charge Storing Layer)
120: Silicon Oxide Layer
122, 124, 126: Gate Electrode

DETAILED DISCLOSURE OF THE INVENTION

In the following detailed description of the preferred embodiments, reference is made to the accompanying drawings which form a part hereof, and in which is shown by way of illustration specific preferred embodiments in which the inventions may be practiced. These preferred embodiments are described in sufficient detail to enable those skilled in the art to practice the invention, and it is to be understood that other preferred embodiments may be utilized and that logical, mechanical and electrical changes may be made without departing from the spirit and scope of the present inventions. The following detailed description is, therefore, not to be taken in a limiting sense, and scope of the present inventions is defined only by the appended claims.

Figure 7:
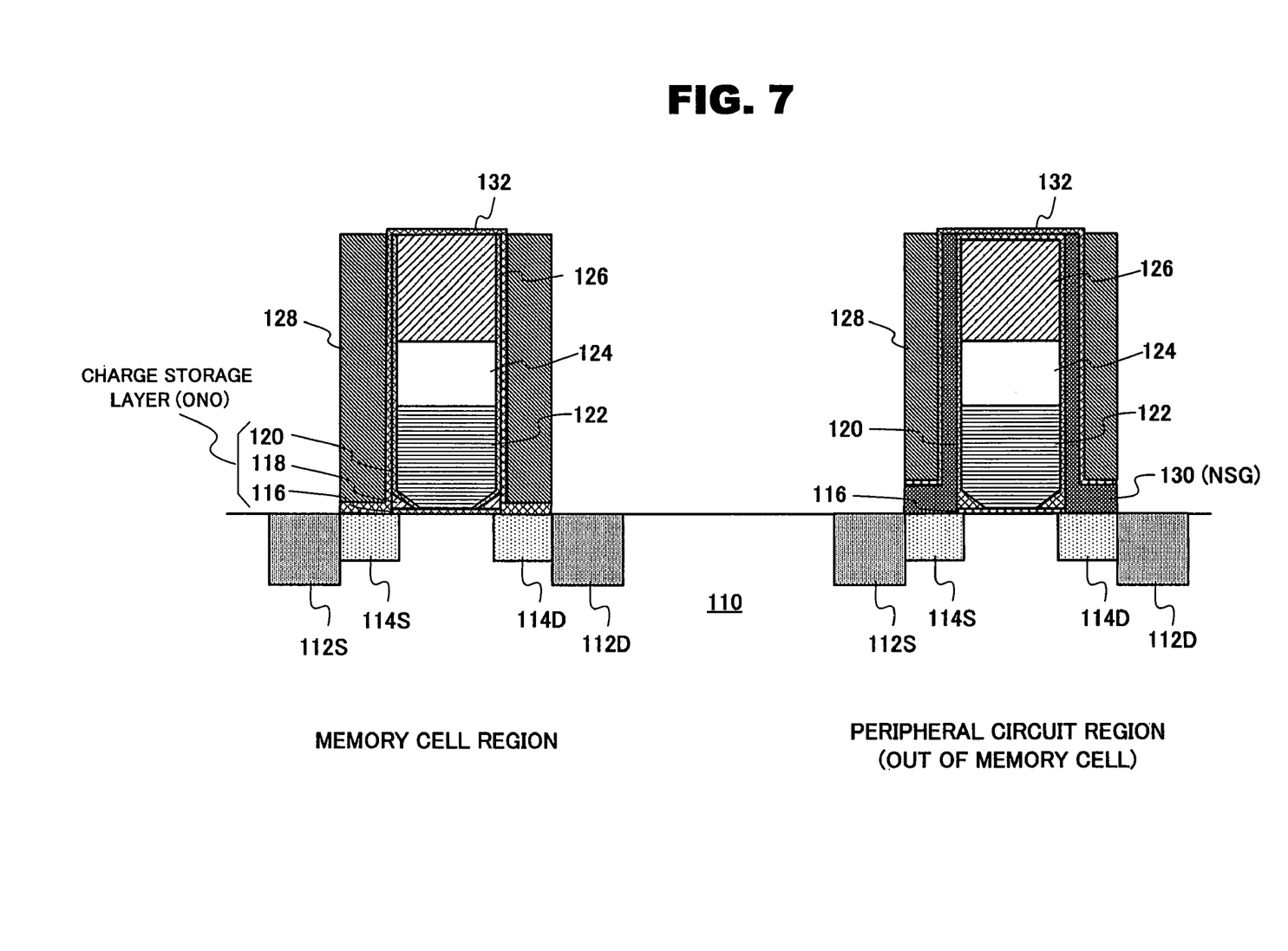
FIG. 7 is a cross-sectional view illustrating a semiconductor device according to a preferred embodiment of the present invention.

FIG. 7 shows the structure of a non-volatile memory device according to a preferred embodiment of the present invention. In FIG. 7, a memory cell region is illustrated at the left side while a peripheral circuit region (not a memory cell region or out of a memory cell region) is illustrated at the right side. According to the memory device of the present embodiment, two-bit data can be stored in a single cell. Electrons are stored or trapped at the right and left sides of an ONO (Oxide-Nitride-Oxide) layer 116, 118, 120, which is formed on the right and left sides of a gate electrode.

When storing electrons in a charge storage layer 118, a source and a substrate are grounded, while a gate and a drain are applied with a high voltage. In this stage, since a strong electric field in a transverse direction is generated around the drain, and electrons passed through a channel get in a high-energy condition (hot electrons), those hot electrons get close to (pulled toward) an electric field in a vertical direction, generated around the gate electrode. When reading data, electrons are stored in a nitride layer 118 of the ONO layer, formed at a lower portion of a sidewall, so that a resistance value of an n- layer, formed at a lower portion of the ONO layer, is changed. As a result, the read data can be distinguished between "1" and "0".

In structure, as shown in FIG. 7, an N+ region 112 and an N- region 114 are formed in a surface area of a silicon substrate 110. A silicon oxide layer 116, a poly-silicon layer 122, WSi layer 124 and a SiN layer 126 are formed on the silicon substrate 110. A nitride layer 118, a silicon oxide layer 120 and an insulating layer 128 are formed (layered) on a sidewall of the gate electrode. The nitride layer 118 is able to store electric charges. The nitride layer 118 is shaped to be a wedge-shape (notch-shape) having an edge extending into the both sides of a gate electrode. Such a nitride layer 118 is shaped to have a width of about 4 nm.

Next, the structure of a peripheral circuit region (not a memory cell region) is described. An N+ region 112 and an N- region 114 are formed in a surface area of a silicon substrate 110, in the same manner as the memory cell region. A silicon oxide layer 116, a poly-silicon layer 122, a WSi layer 124 and a SiN layer 126 are formed on the silicon substrate 110. A silicon oxide layer, a NSG layer 130, a silicon oxide layer 20 and an insulating layer 28 are formed (layered) on a sidewall of the gate electrode. A nitride layer for storing charges is not formed in the peripheral circuit region.

FIGS. 8 to 14 show fabrication steps of a non-volatile memory device, shown in FIG. 7.

Figure 8:
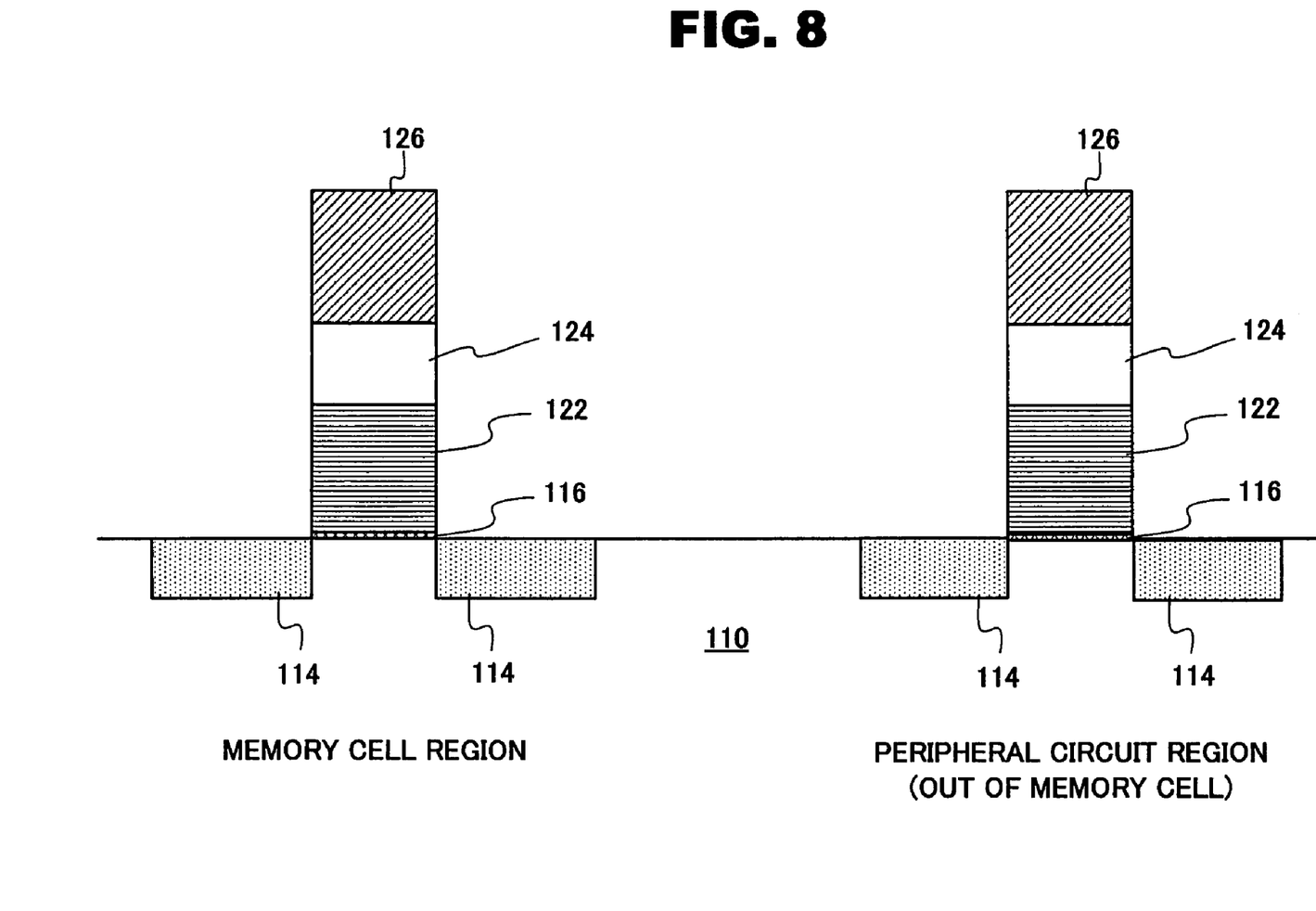
FIG. 8 is a cross-sectional view showing a fabrication step of the semiconductor device, shown in FIG. 7.

Firstly, as shown in FIG. 8, a silicon oxide layer 116 (gate insulating layer), a poly-silicon layer 122, a WSi layer 124 and a silicon nitride layer 126 are formed on a silicon substrate 110 both in the memory cell region and peripheral circuit region. For example, if a gate length is determined to be 0.13 um, the silicon oxide layer 116 would be formed to have a thickness of 90 angstroms (Å), the poly-silicon layer 122 would be formed to have a thickness of 700 angstroms (Å), the WSi layer 124 would be formed to have a thickness of 1000 angstroms (Å) and the silicon nitride layer 126 would be formed to have a thickness of 2000 angstroms (Å).

Next, a gate electrode is shaped (patterned) by a lithographic process both in the memory cell region and peripheral circuit region. Subsequently, the silicon nitride layer 126 is etched by a dry-etching process. After that, the WSi layer 124 and the poly-silicon layer 122 are dry-etched.

Next, a resist layer is removed by an ashing process and wet-washing process to form a gate electrode, as shown in FIG. 8. After that, ions are implanted into the silicon substrate 110 to form an N- region (LDD) 114.

Figure 9:
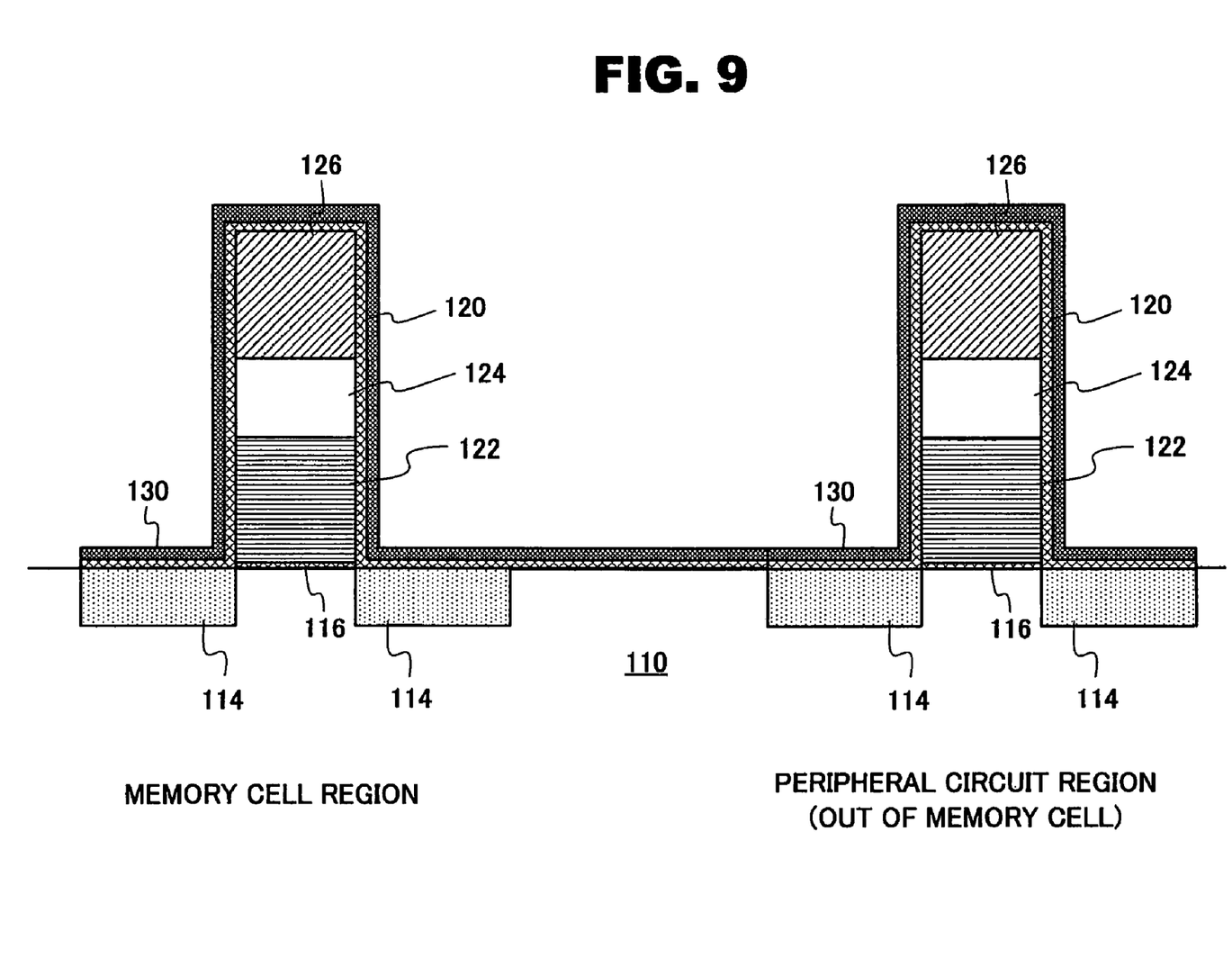
FIG. 9 is a cross-sectional view showing a fabrication step of the semiconductor device, shown in FIG. 7.

Next, a silicon oxide layer 120 is formed by a thermal oxidation process entirely both in the memory cell region and peripheral circuit region, as shown in FIG. 9. For example, if a gate length is determined to be 0.13 um, the thermal-oxidized layer 120 would be formed to have a thickness of 65 angstroms (Å). After that, an NSG layer 130 is formed at a surface area of the silicon oxide layer 120. For example, if a gate length is determined to be 0.13 um, the NSG layer 130 would be formed to have a thickness of 100 angstroms (Å).

Figure 10:
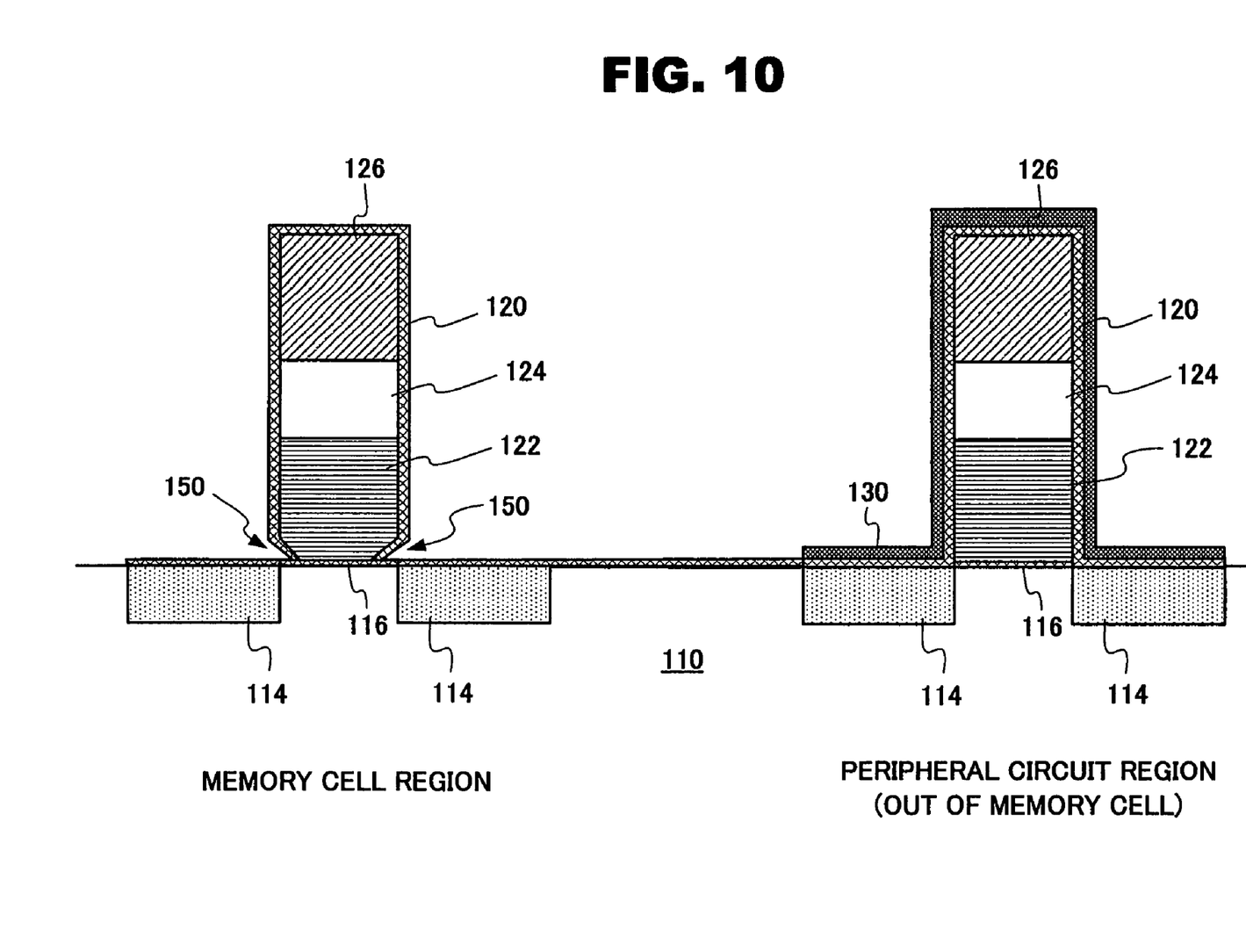
FIG. 10 is a cross-sectional view showing a fabrication step of the semiconductor device, shown in FIG. 7.

Next, as shown in FIG. 10, the NSG layer 130, formed in the memory cell region, is removed by a photo-lithography process and an etching process. For example, if a gate length is determined to be 0.13 um, the etching process using a solution including 1% of HF (hydrofluoric acid) would be carried out for 180 seconds. On the other hand, the NSG layer 130, formed in the peripheral circuit region, is not removed but remained.

Figure 11:
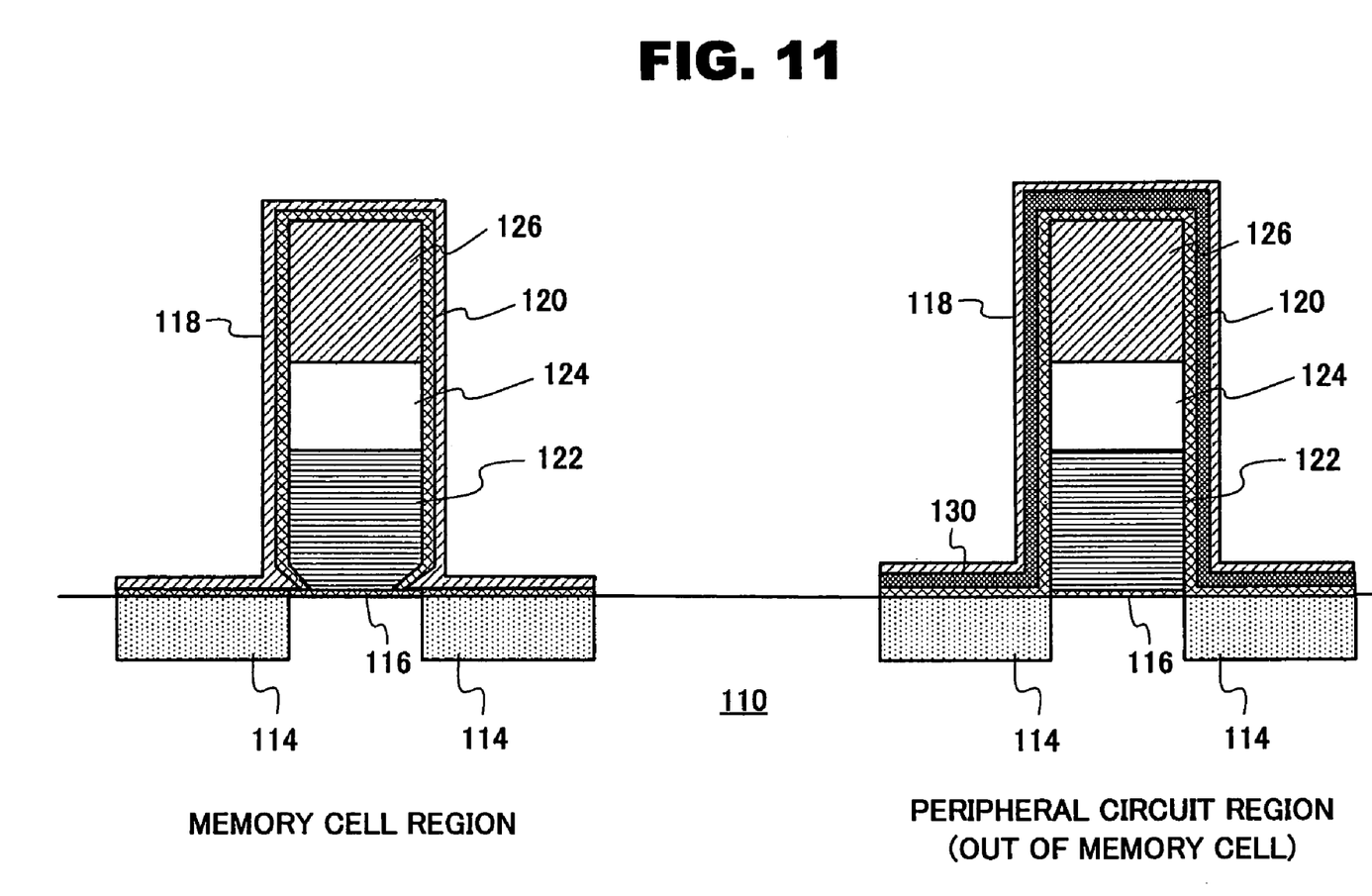
FIG. 11 is a cross-sectional view showing a fabrication step of the semiconductor device, shown in FIG. 7.

Next, as shown in FIG. 11, a SiN layer 118 is formed on the oxide layer 120 in the memory cell region by a CVD process, while a SiN layer 118 is formed on the NSG layer 130 in the peripheral circuit region by a CVD process. For example, if a gate length is determined to be 0.13 um, the SiN layer 118 would be formed to have a thickness of 45 angstroms (Å).

Figure 12:
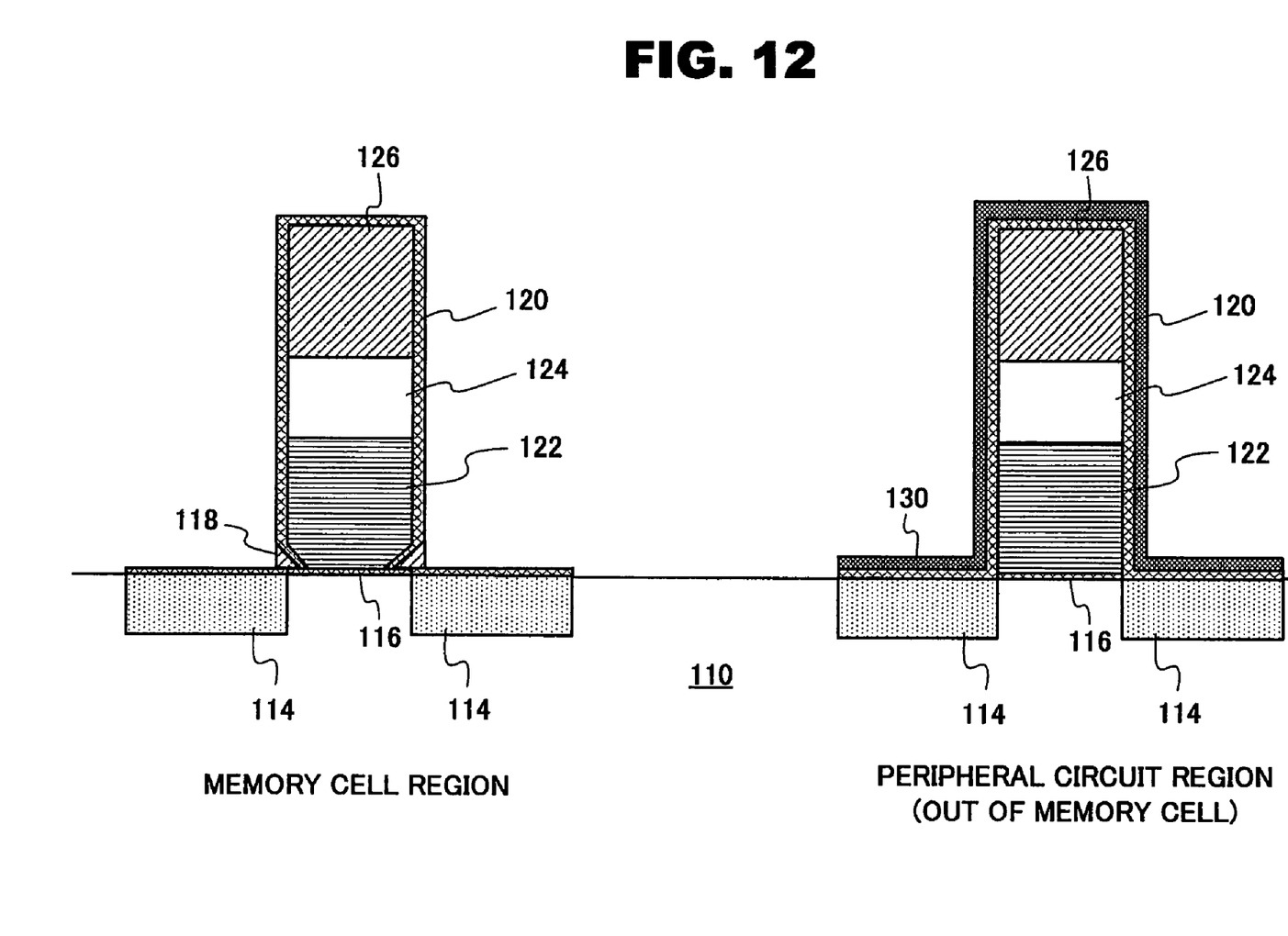
FIG. 12 is a cross-sectional view showing a fabrication step of the semiconductor device, shown in FIG. 7.

Next, as shown in FIG. 12, both in the memory cell region and peripheral circuit region, the nitride layer 118 is removed by a dry-etching process. The etching process may be carried out under condition in that CHF3=10 sccm, CF4=45 sccm, O2=10 sccm, Ar=90 sccm, RF=100W, pressure=50 mTorr, time=10 sec. Under this condition, sides of the silicon nitride layer is polished and cut off due to isotropic etching. However, the silicon nitride layer (charge storing layer) 118 is partially remained only at a notched (wedge) portion 150 in the memory cell region, because the silicon nitride layer 118 has a larger thickness at the notched portion 150. On the other hand, in the peripheral circuit region, since a notched portion is not formed, the silicon nitride layer 118 is removed entirely.

Figure 13:
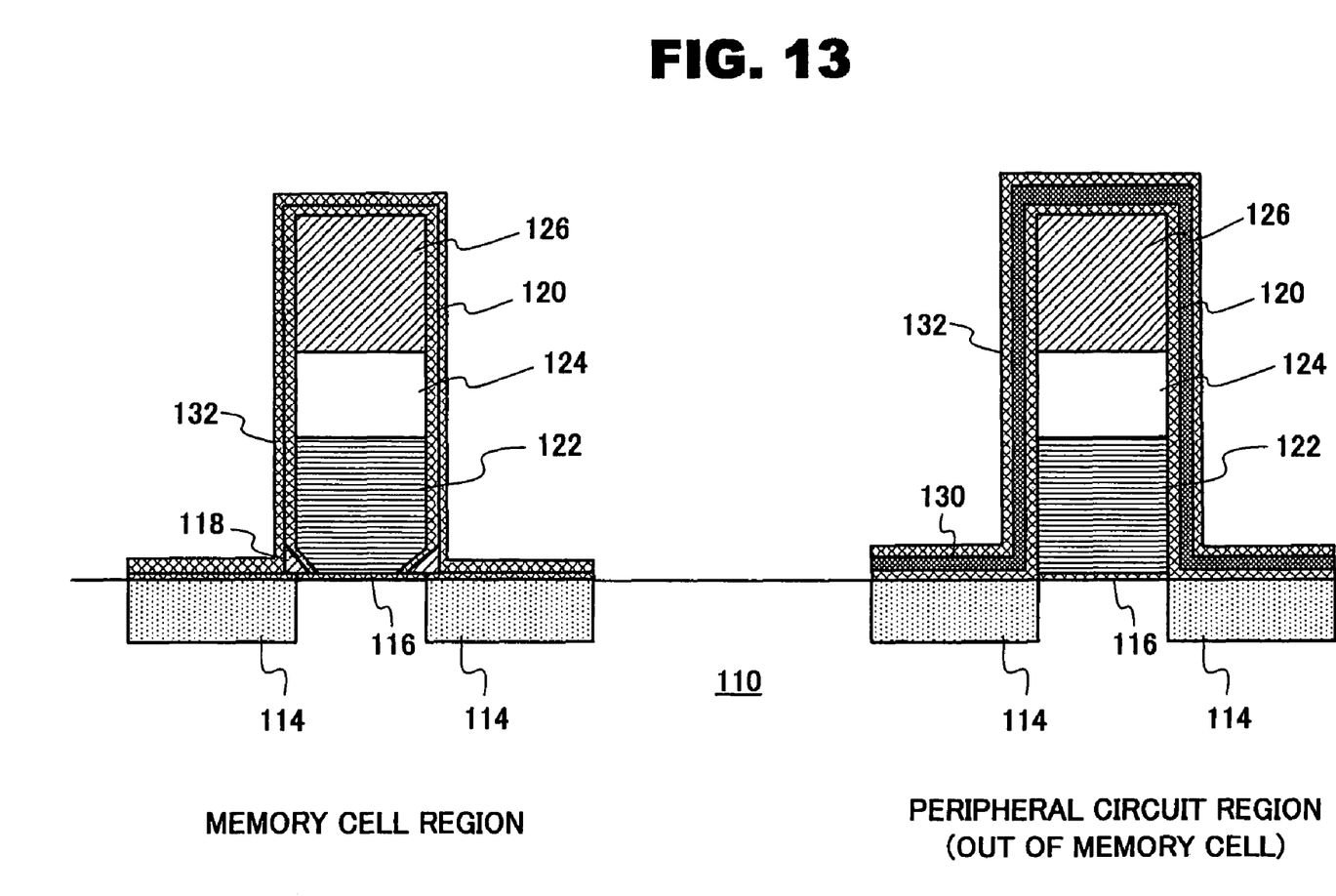
FIG. 13 is a cross-sectional view showing a fabrication step of the semiconductor device, shown in FIG. 7.

Subsequently, as shown in FIG. 13, an oxide layer 132 is formed entirely both in the memory cell region and peripheral circuit region. Another oxide layer 120 is layered on the oxide layer 132 in the memory cell region. On the other hand, in the peripheral circuit region, the oxide layer 132 is formed on the NSG layer 130. For example, if a gate length is determined to be 0.13 um, the oxide layer 132 would be formed to have a thickness of 65 angstroms (Å).

Figure 14:
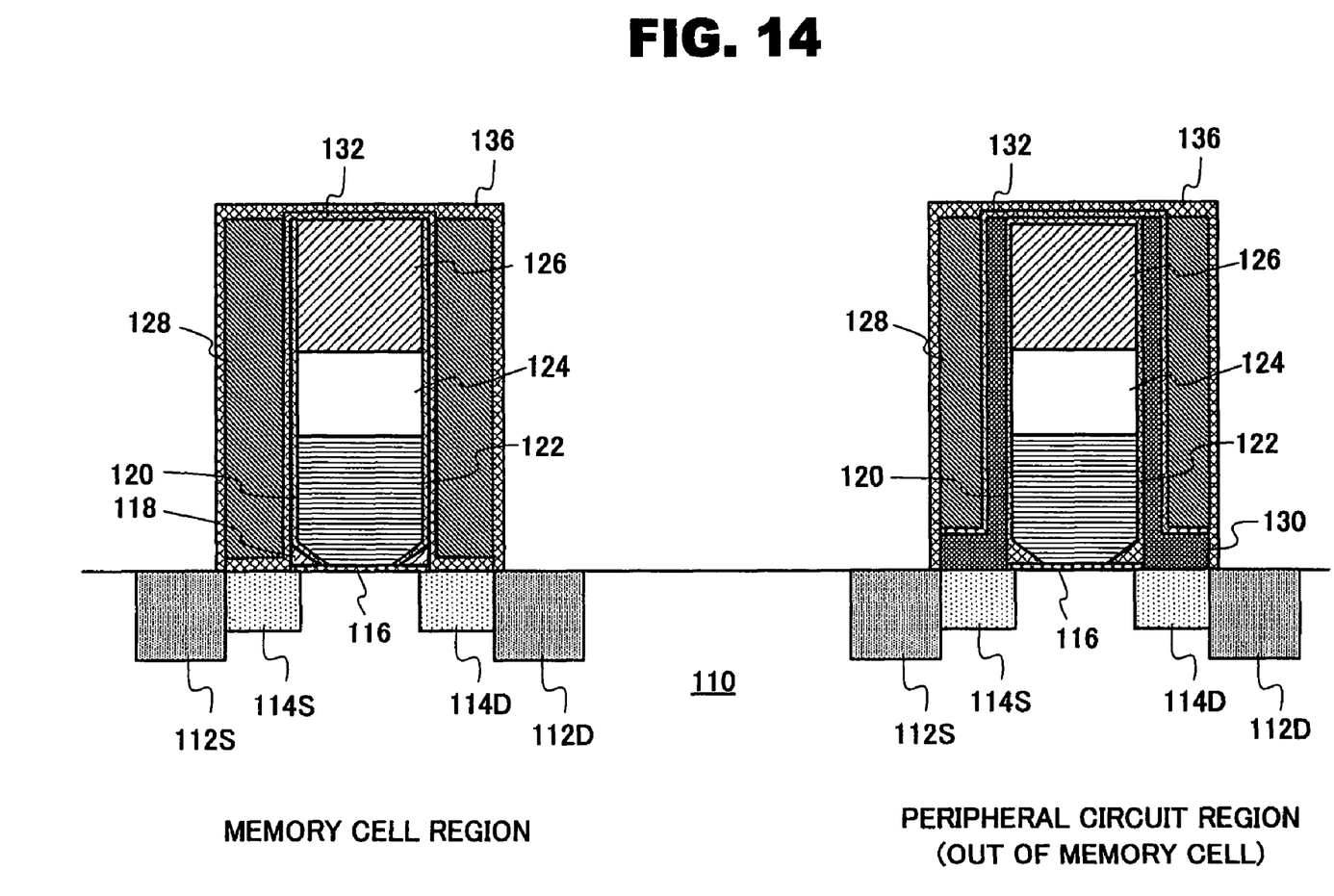
FIG. 14 is a cross-sectional view showing a fabrication step of the semiconductor device, shown in FIG. 7.

Next, as shown in FIG. 14, both in the memory cell region and peripheral circuit region, a SW insulating layer 128 is formed on the oxide layer 132 by a CVD and a dry-etching process. For example, if a gate length is determined to be 0.13 um, as the SW layer 128, an oxide layer or a nitride layer having a thickness of 30 nm could be used. The etching process may be carried out under condition in that CHF3=30 sccm, CF4=5 sccm, Ar=160 sccm, RF=200W, pressure =100 mTorr.

Subsequently, a NSG layer 136, which is to be used as a mask in a high-density implantation process, is formed on the entire surface including a sidewall 128. The NSG layer 136 may be formed to have a thickness of 100 angstroms (Å) by a CVD process. Next, an N+ layer 112 is formed in a source/drain region of the memory cell region by a photolithography-implantation process. Next, an N+ layer 112 is formed in a source/drain region of the peripheral circuit region by a photolithography-implantation process. A type of impurity to be ion-implanted is selected according to the type of transistors (N or P). After that, as shown in FIG. 7, the NSG layer 136 is removed.

Hereinafter, writing operation of the semiconductor memory device, shown in FIG. 7, is described. Initially, the charge storage layer 118 stores no electric charge, which is corresponding to a logical value of "1". A logical value of "0" will be written in a drain region 112D.

A positive voltage (+Vdw) is applied to the drain region 112D, a positive voltage (Vgw) is applied to the gate electrode, and a source region 112S is grounded. Under such a condition for writing operation, electric field is concentrated around a drain side N– region 114D, having an impurity density lower than the drain region 112D. Therefore, generation of hot electrons (high-energy electrons) is concentrated in the drain side N– region 114D. As a result, such hot electrons are selectively transferred from the drain side N– region 112D through an energy barrier of the tunnel oxide layer into the charge storage layer 118, and data are written therein.

Next, reading operation of the semiconductor memory device, shown in FIG. 7, is described. A positive voltage (Vsr) is applied to the source region 112S, a positive voltage (+Vgr) is applied to the gate electrode, and the drain region 112D is grounded. Since the charge storage layer 118 stores charges (electrons) at the drain region 112D side, a resistance value of the drain side N– region 114D is increased. As a result, carriers are hardly supplied to a channel region, so that sufficient current does not flow.

On the other hand, if the memory cell is in the initial state, in which a logical value "1" is stored, the charge storage layer 118 would store no charge, and a resistance value of the drain side N– region 114D would not be changed. As a result, carries are supplied to the channel region, and sufficient electric current flows. It can be detected or distinguished if "1" or "0" is stored in the memory cell by observing or finding change of electric current flowing therein.

Next, erasing operation of the semiconductor memory device, shown in FIG. 7, is described. When erasing data stored in the drain region 112D side, ultraviolet irradiation or thermal treatment is carried out to the charge storage layer 118 to neutralize electric charges stored in the charge storage layer 118.

As described above, according to the present invention, when data-reading operation is carried out, electric filed can be concentrated around the N– region 114S and 114D, having a lower density of impurity as compared with the source region 112S and drain region 112D. Therefore, hot carriers (electric charge) can be intensively generated around the N– regions 114S and 114D. As a result, electric charge can be selectively transferred from the N– regions 114S and 114D into the charge storage layer 118. Electric charge is stored in the charge storage layer 118, so that writing operation of information (logic value of "0" or "1") can be carried out efficiently.

Further, according to the present invention, reading operation of data can be carried out by detecting a resistance value of the N– regions 114S and 114D, which varies according to if the charge storage layer 118 stores electric charge or not. When the charge storage layer 118 is charged (storing charges), a resistance value of the N– regions 114S and 114D is increased, so that carriers are hardly supplied and sufficient current does not flow. On the other hand, when the charge storage layer 118 is not charged (storing no charge), a resistance value of the N– regions 114S and 114D does not change, so that carriers are supplied and sufficient current flows. Using such phenomenon, logical values "0" and "1" can be distinguished precisely.

What is claimed is:

1. A method for fabricating a non-volatile memory device comprises:
    forming a gate electrode on a semiconductor layer;
    forming a thermal oxidation layer and a NSG layer on a surface of the gate electrode;
    removing the NSG layer located only in a memory cell region by a HF treatment to form a notch or wedge shape gap extending into a bottom end of the gate electrode;
    forming a charge storage layer on a surface of the gate electrode and into the notch or wedge shape gap; and
    selectively removing the charge storage layer to remain only inside the notch or wedge shape gap of the memory cell region.

2. A method according to claim 1, wherein
    said charge storage layer is formed to store one bit information at each side of said gate electrode.

3. A method according to claim 1, wherein
    said memory cell region comprises a pair of silicon oxide layers,
    said charge storage layer is of a silicon nitride layer, which is formed between said pair of silicon oxide layers to form a ONO layered structure.

4. A method according to claim 3, wherein
    said memory cell region comprises a LDD layer located under said ONO layered structure; and a side wall insulating layer formed on a side surface of said gate electrode,
    said side wall insulating layer is located above said ONO layered structure.

5. A method according to claim 1, wherein
    said charge storage layer is of a poly-silicon layer.

6. A method according to claim 4, wherein
    said side wall insulating layer is of a silicon nitride layer.

7. A method according to claim 4, wherein
    said side wall insulating layer is formed using said silicon oxide layer arranged above the storage charge layer of the ONO layered structure.

* * * * *